PROCESS FOR SUPPORTING AND NONUNIFORMLY TREATING ARTICLES

Original Filed Dec. 21, 1970 4 Sheets-Sheet 1

PROCESS FOR SUPPORTING AND NONUNIFORMLY TREATING ARTICLES

Original Filed Dec. 21, 1970 4 Sheets-Sheet 2

PROCESS FOR SUPPORTING AND NONUNIFORMLY TREATING ARTICLES

Original Filed Dec. 21, 1970 4 Sheets-Sheet 3

PROCESS FOR SUPPORTING AND NONUNIFORMLY TREATING ARTICLES

Original Filed Dec. 21, 1970 4 Sheets-Sheet 4

United States Patent Office

Re. 28,267
Reissued Dec. 10, 1974

28,267

PROCESS FOR SUPPORTING AND NONUNIFORMLY TREATING ARTICLES

John J. Rackus, Whitehall, John P. Skilbeck, Allentown, and Alfons H. Szkudlapski, Bethlehem, Pa., assignors to Western Electric Company, Incorporated, New York, N.Y.

Original No. 3,692,638, dated Sept. 19, 1972, Ser. No. 100,176, Dec. 21, 1970. Application for reissue Feb. 8, 1974, Ser. No. 440,933
Int. Cl. B01k *3/00;* C23b *5/48, 5/70*
U.S. Cl. 204—15 14 Claims

Matter enclosed in heavy brackets [ ] appears in the original patent but forms no part of this reissue specification; matter printed in italics indicates the additions made by reissue.

ABSTRACT OF THE DISCLOSURE

In making transistors using lead frames, improved bonds and savings in gold result from plating gold more heavily and in controlled amounts at the ends of the lead frames where wire and semiconductive chip bonds are to be made. To accomplish such nonuniform plating, the lead frames are arranged in a cylindrical configuration so that the ends of the frames where bonds are to be made are on the outer periphery of the configuration and are spaced one from the other. Also, the opposite carrier strips, which are eventually trimmed away, are on the internal portion of the configuration. A cathode is connected to the lead frames, which are then rotated past an anode in a plating bath, thereby nonuniformly plating the lead frames. Such arrangement of the lead frames and rotation of them in the bath also results in the plating of a large number of frames using a minimum volume of a tank holding the bath. An increase in plating rates is also achieved.

BACKGROUND OF THE INVENTION

Field of the invention

This invention relates to methods of nonuniformly treating articles and supporting them therefor, and more particularly, to methods for plating a nonuniform layer of a metal on a conductive article.

This invention is suited for use in the manufacture of semiconductive devices such as transistors, diodes, integrated circuits or the like. While this invention is particularly suited for electroplating a nonuniform gold layer on a nickel lead frame for transistors, it is also equally well suited for other chemical, mechanical or combined chemical and mechanical treating applications, such as electroless plating, anodizing, polishing, cleaning or the like, wherein different degrees of interaction by the treating medium and the treated article are desired.

Description of the prior art

In the manufacture of transistors, leads for the transistors are formed from a lead frame stamped from a sheet of conductive metal such as nickel. Each lead frame has one group of three leads for each transistor. Each group includes one outer lead having a curved end portion upon which a semiconductive chip is bonded, an inner lead having a straight end portion upon which a fine wire extending from the chip is bonded, and another outer lead having another straight end portion upon which another fine wire extending from the chip is bonded.

The individual leads of each frame are joined together by a perforated carrier strip at one end so that the ends of the leads where bonding is to be performed are free of the strip. The leads are joined together intermediate their ends by a relatively narrow support strip. Both of the strips are severed to separate the individual leads prior to the completion of the ultimate transistor. (See Maguire, Koons and Jarrett, "Plastic Encapsulated Transistors." The Western Electric Engineer, pp. 41–51, October 1970.)

Because an increased and controlled thickness of gold on the free end portions of the leads improves any bonds formed on these ends, it is desirable to have a greater thickness of gold on such ends than on the remainder of the leads. Since chip bonds normally require a greater thickness of gold to obtain good bonds than do wire bonds, it is also desirable that the curved free end portion of the leads have a greater thickness of gold than the straight free ends of the leads. Since the perforated carrier strip is ultimately trimmed away, it is further desirable to have the least thickness of gold on it. While the leads themselves require some gold for thermal protection of the semiconductive chip and for corrosion protection and solderability of the leads, they do not require as much thickness of gold as do the free ends where the chip and wire bonds are to be formed, but require more gold than the carrier strip. Such a nonuniform distribution of gold can result in a very desirable efficient use and substantial savings of gold.

In treating the lead frames by plating or similar techniques, it is also desirable to arrange them so as to treat a maximum number of frames at a time using a minimum volume of a tank holding a treating medium. Such an arrangement minimizes the space required for the treating tank. In addition, it is desirable that the treating time be minimized and that the treating rate be maximized. Further, it is desirable to improve the control over the treating operation.

While it is desirable that the leads and the carrier strip have a nonuniform thickness of gold, it is also desirable that each frame be treated the same.

SUMMARY OF THE INVENTION

It is, therefore, an object of this invention to provide new and improved methods of supporting articles in a treating medium.

Another object of this invention is the provision of methods of nonuniformly treating articles.

A further object of this invention is to provide methods of and apparatus for nonuniformly plating a layer of a metal on a plurality of conductive articles.

With these and other objects in view, the present invention contemplates a new method of supporting articles in a treating medium which includes the step of inserting the articles in a plurality of slots formed in the outer surface of a member to thereby arrange the articles in a cylindrical configuration. In this configuration, the outer side portions of the articles are on the outer periphery of the cylindrical configuration and the articles are spaced one from the other. The method also includes the step of retaining the articles in this configuration.

BRIEF DESCRIPTION OF THE DRAWINGS

Other objects and advantages of the present invention may be more clearly understood by reference to the following detailed description and drawings therein:

FIG. 4 is an enlarged view of a portion of FIG. 2, showing the slots of FIG. 2 in greater detail;

DETAILED DESCRIPTION

Lead frame

Figure 1:
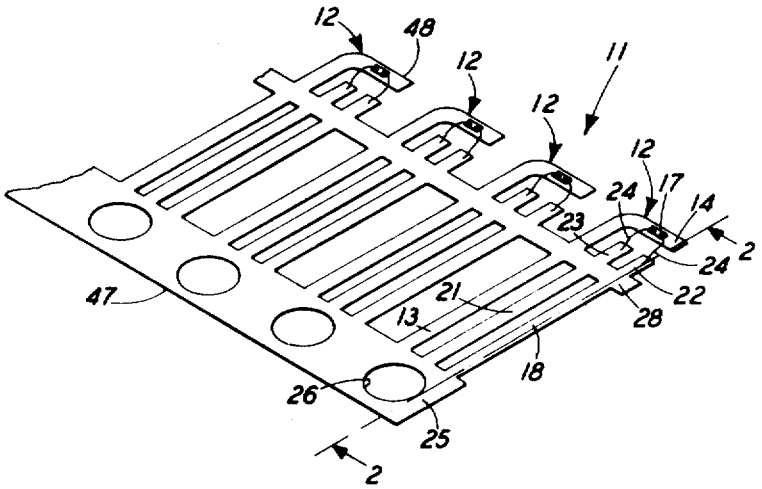
FIG. 1 is a greatly enlarged, fragmentary, perspective view of a lead frame, showing leads joined together by a perforated carrier strip and a relatively narrow support strip, showing semiconductive chips bonded to curved portions of the free ends of outer leads, and showing fine wire extending from the chips to the other free ends of inner and other outer leads.

Referring now to the drawings and in particular to FIG. 1, a lead frame, designated generally by the numeral 11, is shown. The frame 11 has a plurality of groups of leads, designated generally by the numeral 12, one group being associated with each transistor which is ultimately to be fabricated using the lead frame 11. Each group 12 includes an outer lead 13 having a curved end portion 14 to which a semiconductive chip 17 is bonded. Each group also has another outer lead 18 and an inner lead 21, both of which have straight end portions 22 and 23 to which fine gold wires 24 extending from the chip 17 are bonded.

Each lead frame 11 includes a carrier strip 25 having perforations 26 therein. The perforated carrier strip 25 joins the individual leads 13, 18 and 21 together at one of their ends so that the opposite end portions 14, 22 and 23 where bonds are to be formed are free. The leads 13, 18 and 21 are joined together intermediate their end portions 14, 22 and 23 by a relatively narrow support strip 28.

Typically, the lead frame 11 is stamped from a nickel sheet about 10 mils thick. In the prior art a uniform layer of gold of about 0.255 to about 0.315 mil was plated on the nickel lend frame 11.

Method and apparatus

In accordance with the present invention, a plurality of articles, such as the lead frame 11 (FIG. 1), a substantially planar article or the like, is nonuniformly treated. While the treatment may be any of a number of different chemical or mechanical or combined chemical and mechanical treatments, such as electroplating, electroless plating, anodizing, polishing, cleaning or the like, the present invention will be described in connection with electroplating. However, it is to be understood that treatments other than electroplating are within the spirit and scope of this invention.

Figure 2:
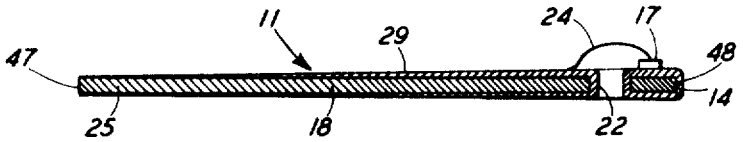
FIG. 2 is a sectional view taken along line 2—2 of FIG. 1, showing a nonuniform layer of a metal on the lead frame of FIG. 1.

More specifically, a nonuniform layer 29 (FIG. 2) of a metal, such as gold or the like, is electroplated on the lead frame 11 (FIGS. 1 and 2) so that the layer 29 has the least thickness on the carrier strip 25, a greater thickness on the leads 13, 18 and 21, a still greater thickness at the straight free end portions 22 and 23 where wire bonding is to be performed, and the greatest thickness at the curved free end portion 14 where chip bonding is to be performed.

Loading

In carrying out the present invention, into a cup 30 (FIG. 3) there is placed an assembly including a base 31, a rotatable shaft 32 fixed to and extending from the top side of the base 31 and a hollow tubular member 33 with its bottom end also fixed to the top side of the base 31. The placing of this assembly in the cup 30 positions the bottom side of the base 31 in a central depression 42 in the cup 30 and extends the shaft 32 and the tubular member 33 from the cup 30 and beyond its side walls.

Figure 3:
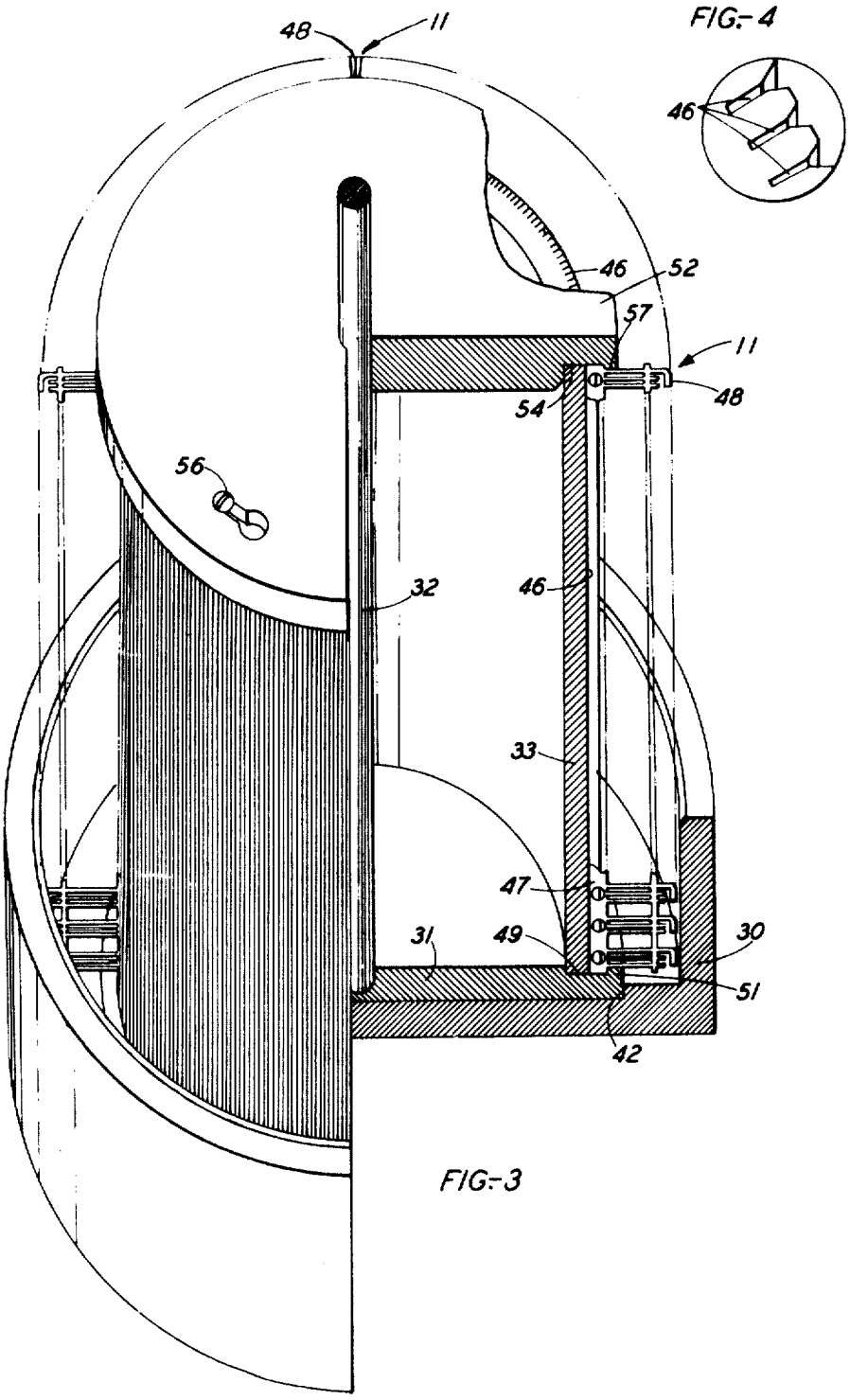
FIG. 3 is a perspective view, partly in section, showing a tubular member, having a plurality of spaced paralled slots, positioned within and extending from a loading cup that assists the placing of the frames in the slots to arrange them in a cylindrical configuration.

As shown in FIGS. 3 and 4, the hollow tubular member 33 has a plurality of spaced slots 46 formed in its outer surface that are parallel to each other, and to the shaft 32 and the axis of the member 33. The bottom ends of the slots 46 are closed by an annular indentation 49 formed in the top side of the base 31.

Typically, the slots 46 have a width of about 15 to 20 mils so that they easily receive the lead frames 11 with a thickness of about 10 mils. The inner side portions 47 (FIGS. 1 and 3) of a plurality of lead frames 11 are individually placed in the slots 46. By so placing these frames 11, they are arranged in a substantially radial, fan like manner and in a hollow cylindrical configuration, as shown in FIG. 3. In this configuration the outer side portions 48 of the frames 11 are located on the outer periphery of the configuration and are spaced more from each other than the inner side portions 47, as is apparent from FIG. 3.

Since the bottom ends of the slots 46 are enclosed by the annular indentation 49 in the base 31, the frames 11 are axially retained in the slots 46 to prevent them from dropping out. Also, the frames 11 are laterally retained in the slots 46 by the loading cup 30 and a rim 51 formed by the indentation 49 in the base 31.

After the frames 11 are loaded in the slots 46, an insulative capping member 52 (FIG. 3) having an annular indentation 54 is mounted removably to the top end of the tubular member 33 by conventional securing devices, such as machine screws 56 or the like.

By so mounting the capping member 52, the top end of the tubular member 33 fits into the annular indentation 54 and closes the top ends of the slots 46 to axially retain the frames 11 in the slots 46. Also, a rim 57 formed by the indentation 54 laterally retains the frames 11 in the slots 46. Thus, the combination of the slots 46 in the tubular member 33, the indentations 49 and 54 in the base 31 and in capping member 52, and the rims 51 and 57 in the base 31 and in capping member 52 completely support and retain the frames 11 in the cylindrical configuration. Therefore, after the capping member 52 is mounted to the tubular member 33, the loading cup 30 is no longer necessary to competely support and retain the frames 11 in the cylindrical configuration.

Treating medium

Figure 5:
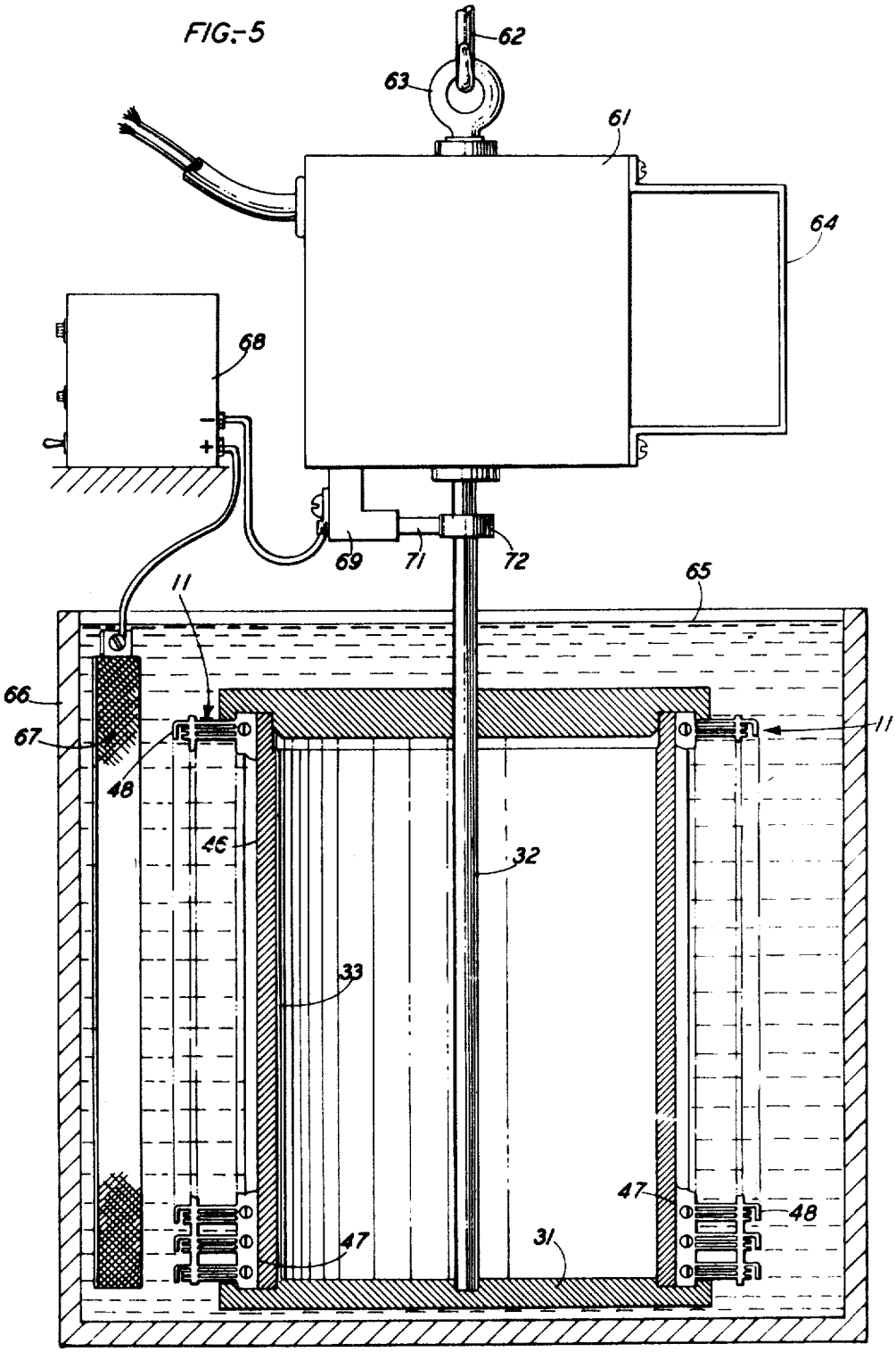
FIG. 5 is a front elevational view, partly in section, of the tubular member of FIG. 3 having a plurality of lead frames mounted in slots formed in its outer peripheral surface and immersed in a bath for nonuniformly electroplating gold on each frame.

Next, the assembly of the base 31, the shaft 32, the tubular member 33, the frames 11, and the capping member 52 are removed from the loading cup 30 by lifting such assembly by the shaft 32 from the cup 30. The shaft 32 is then connected to a conventional rotating device, such as a motor 61 (FIG. 5).

The assembly is next immersed in a treating medium with the shaft 32 extending therefrom by suspending the motor 61 from a fixed hook 62 by an eyelet 63 fastened to the motor 61. Also, the motor 61 is provided with a handle 64 to facilitate the manipulation of the motor and the assembly connected thereto. While the assembly is shown in FIG. 5 as being suspended vertically by the hook 62 and the eyelet 63, it should be understood that the assembly may be positioned other than vertically in the treating medium by the use of conventional supporting devices. Such nonvertical positioning does not reduce the effectiveness of the invention.

Illustratively, the present invention is used for electroplating a nonuniform layer of a metal such as gold on a conductive article such as a nickel lead frame 11. Accordingly, the treating medium is a gold electroplating bath 65 held in a tank 66. Typically, the bath 65 is an acidic plating solution based on ammonium citrate and potassium gold cyanide. Also, it may be desirable to preplate the frames 11 in a plating solution based on potassium phosphate with low concentrations of potassium gold cyanide.

In addition to the assembly, the electroplating bath 65 contains an anode 67 of a plating source 68 which also has a cathode 69 connected to the shaft 32 by conventional expedients such as a brush 71 and a slip ring 72.

In order to deposit the nonuniform layer 29 (FIG. 2) of gold on the lead frames 11 in accordance with the present invention, the motor 61 (FIG. 5) is energized to revolve the lead frames 11 past the anode 78. The power source 68 is then activated to pass current from such source 68 to the anode 67, the bath 65, the lead frames 11, the walls of the slots 46 of the tubular member 33, the remaining structure of the tubular member 33, the base 31, the shaft 32, the slip ring 72, the brush 71 to the cathode 69 and back to the source 68.

By revolving the frames 11 in the bath 65 past the anode 67 and activating the power source 68, gold is plated from the bath 65 onto the lead frames 11 to form the nonuniform gold layer 29 (FIG. 2) thereon. The gold layer 29 has its greatest thickness at the outer side portions 48 of the lead frames 11, which includes the curved end portion 14 and the straight end portions 22 and 23, and has its least thickness at the inner side portions 47 of the frames 11, which include the perforated carrier strip 25. Further, the layer 29 has a thickness on the leads 13, 18 and 21 greater than that on the carrier strip 25, a still greater thickness on the straight end portions 22 and 23 where the wires 24 and 25 are to be bonded, and its greatest thickness on the curved end portion 14 where the chip 17 is to be bonded.

The gold layer 29 is thicker at the outer side portions 48 of the frames 11 than at the inner side portions 47 of the frames 11, because, it is believed there is a greater interaction of the portions 48 with the plating bath 65 than there is of the portions 47 with such bath 65. More specifically, it is believed that the layer 29 is thicker at the portions 48 than at the portions 47 because the portions 48 have the greatest velocity through the plating bath 65, are spaced further apart and are exposed to a greater undepleted amount of the bath 65. Also, the portions 48 are closer to the anode 64 than the portions 47 when maximum plating occurs (see the lefthand side of FIG. 5). Further, because the portions 47 are located in the slots 46, these portions 47 are exposed to a smaller amount of the undepleted bath 65 and the slots 46 lend to partially mask the portions 47. This aids in reducing the thickness of the gold layer 29 on the portions 47.

Typically, the thickness of the nonuniform gold layer 29 on the frames 11 varies linearly with distance from approximately 0.300 mil at the curved end portion 14 decreasing to approximately 0.060 mil at the carrier strip 25. Such thickness of the layer 29 has been achieved with a plating current of about 30 amps and a rotational speed of 50 r.p.m. The degree to which the thickness of the deposited gold layer is nonuniform is controlled by such factors as the rotational speed of the frames in the bath 65, the spacing of the frames 11, the plating current, and the composition of the plating bath.

By plating the lead frames 11 in accordance with the present invention, substantial savings in gold result and at the same time adequate amounts of gold are plated on the curved end portion 14 of the lead 13 for making good chip bonds and on the straight end portions 22 and 23 of the leads 18 and 21 for making good wire bonds. Also, by arranging the lead frames 11 in the cylindrical configuration a large number of frames 11 can be simultaneously plated using a small-volume tank holding the plating bath. In addition, the plating time can be decreased over prior art techniques and at the same time the treating rate and control over the treating operation is increased.

To prevent gold from being plated from the bath 65 on the shaft 32, the base 31, and the tubular member 33, which are electrically conductive; these elements 32, 31 and 33 are completely coated with a nonconductive film, such as that sold under the trademark "Kynar," by Penwalt. However, the walls of the slots 46 which must make electrical contact with the frames 11 to plate them are not coated. The shaft 32 is also coated with the film except where the slip ring 72 is attached. The capping member 52 is made of an electrically insulative material and therefore, no gold is plated from the bath on it.

The walls of the slots 46 receive a minimum thickness of plated gold, since the frames 11 are inserted in the slots 46 exposing only a small amount of the walls of the slots 46 to the plating bath 65, since the slots 46 are positioned relatively far away from the anode 64, and since the slots 46 receive a relatively low velocity through the bath 65. After being used numerous times to plate large quantities of frames 11, any gold plated on the walls of the slots 46 can be chemically stripped therefrom.

Alternative embodiment

Figure 6:
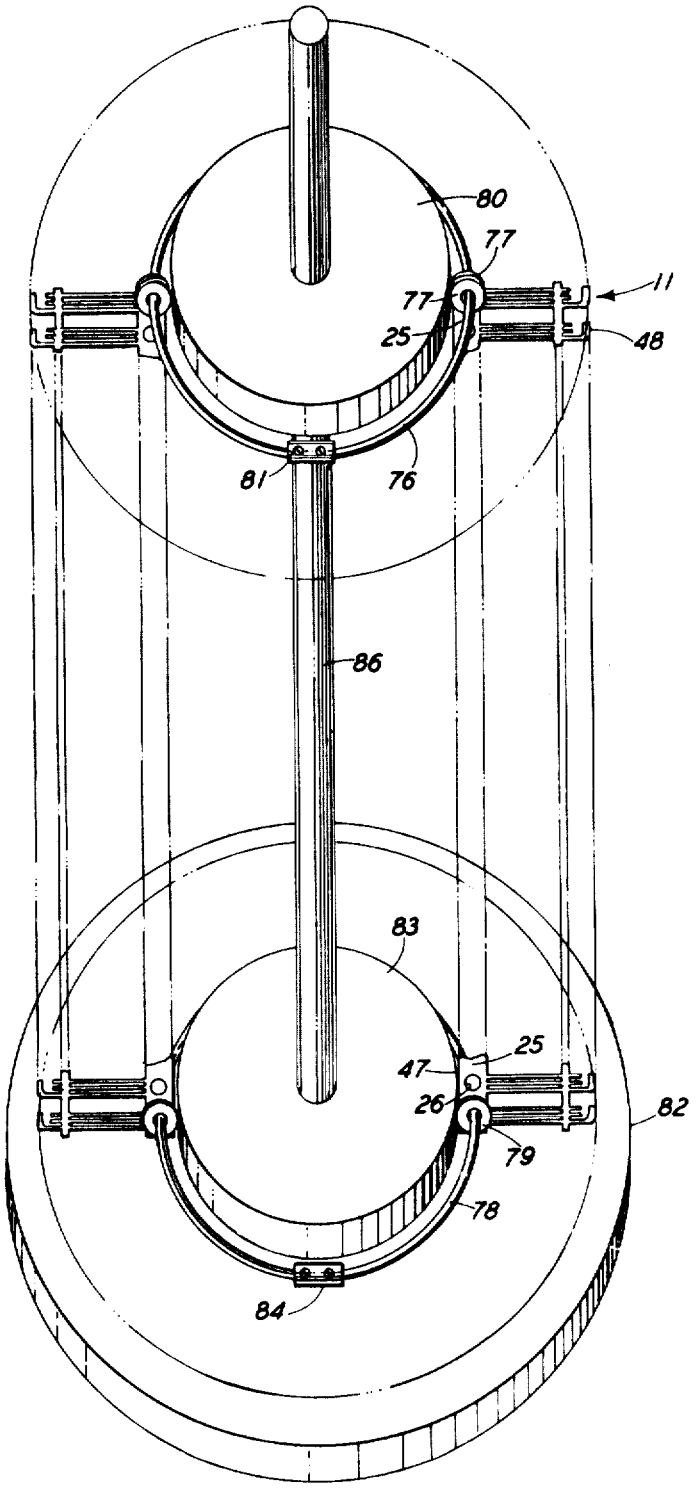
FIG. 6 is a perspective view of an alternative embodiment of the present invention showing a plurality of lead frames mounted in a cylindrical configuration by inserting a flexible wire-like member alternately into perforations formed in the carrier strips of the lead frames and into conductive spacing washers.

An alternative embodiment of the invention is shown in FIG. 6. More specifically, the lead frames 11 are formed in a hollow cylindrical configuration for immersion in the plating bath 65 by first inserting a wire-like member 76 alternately into the uppermost perforations 26 of the carrier strips 25 of the lead frames 11 and then into a plurality of conductive washers 77 spaced from each other by the frames 11.

Also, another wire-like member 78 is inserted alternately into the lowermost perforations 26 of the carrier strips 25 and into a plurality of conductive washers 79 spaced from each other by the frames 11, as shown in FIG. 6.

Next, the wire-like members 76 and 78 are formed into a substantially circular configuration. This results in holding the frames 11 in substantially radial fan-like manner and in arranging of the lead frames 11 in a hollow cylindrical configuration as shown in FIG. 6. In this configuration the outer portions 48 of the frames 11 are located on the outer periphery of the configuration and are spaced more from each other than the inner side portions 47, as is apparent from FIG. 6.

An insulative disc element 80 is positioned in the center of the hollow configuration of the lead frames 11 adjacent the uppermost perforations 26 of the carrier strips 25. The ends of the wire-like member 76 are then joined together to force the frames 11 and washers 77 against the element 80, as shown in FIG. 6. Next, the ends of the wire-like member 76 are fastened with a conventional holding expedient 81 to retain the member 76 in a ring-like configuration.

A conductive base plate 82 having a conductive disc element 93 fixed thereto is then positioned beneath the lead frames 11 in electrical contact with them and the washers 79 so that the element 83 is in the center of the cylindrical configuration, as shown in FIG. 6. The ends of the wire-like member 78 are next joined together to force the frames 11 and the washers 79 against the disc element 83. The ends of the wire-like member 78 are then fastened with a conventional holding expedient 84.

A conductive rotatable shaft 86 is connected through the disc element 80 to the disc element 83. The lead frames 11 joined in a cylindrical configuration by the wire-like members 76 and 78 along with the shaft 86, the base plate 82, and the disc element 83 are immersed in the plating bath 65 (FIG. 5). The cathode 69 is appropriately connected to the shaft 86 and the frames 11 are revolved by the motor 61 past the anode 67 to plate gold from the bath 65 on the frames 11 in the same way that gold was plated on the frames 11 in the embodiment of FIG. 5.

It is to be understood that the above-described arrangements are simply illustrative of the application of the principles of this invention. Numerous other arrangements may be readily devised by those skilled in the art which will embody the principles of the invention and fall within its spirit and scope.

What is claimed is:

1. A method of supporting planar articles in a treating medium, which comprises:

inserting the articles [in] *into* a plurality of slots formed in the outer surface of a member to arrange the articles in a spaced, radial, *loose,* fan-like manner *external to such surface with portions of the articles being free and extending from the slots* to partially mask the inner side portions of the articles and to space the *free,* outer side portions of the articles a greater distance from each other than the inner side portions; and retaining the articles in said manner.

2. The method of claim 1, wherein the outer surface of the member is curved in a convex manner.

3. A method of treating planar articles, which comprises:

arranging the articles in a spaced, radial, *loose,* fan-like manner about an axis with the *axis passing through the* planes of the articles [passing through the axis] and with the outer side portions of the articles *being free and* spaced a greater distance from each other than the inner side portions of such articles;

partially masking the inner side portions of the articles as they are arranged in said manner;

*retaining the articles in said manner;* positioning the articles in a treating medium; and moving the articles about the axis to increase the interaction of the outer side portions with the treating medium while the interaction with the partially masked inner side portions is decreased to thereby nonuniformly treat the articles.

4. A method of plating a nonuniform layer of metal on a plurality of conductive articles, which comprises:

arranging the articles in a spaced, radial, fan-like manner about an axis with the planes of the articles passing through the axis to form a cylindrical configuration of the articles with the outer side portions of the articles on which the greatest thickness of the metal layer is to be formed are spaced a greater distance from each other than the inner side portions of the articles on which the least thickness of the layer is to be formed and with the outer portions of the articles located on the outer periphery of the cylindrical configuration;

partially masking the inner side portions of the articles as they are arranged in said manner;

immersing the articles in a metal plating bath to plate the metal from the bath on the conductive articles; and moving the articles during the plating to form the metal layer on the articles with the outer side portions thereof having the greatest thickness of the layer and the partially masked inner side portions of the articles having the least thickness of such layer.

5. The method of claim 4, wherein the articles are moved by revolving them about the axis of the cylindrical configuration.

6. The method of claim 4, wherein the articles are immersed in the plating bath adjacent an anode of a plating source also having a cathode, and wherein the cathode is electrically connected to the articles.

7. The method of claim 4, wherein the articles are arranged in a hollow cylindrical configuration by retaining their inner side portions individually in a plurality of spaced, radial slots parallel to the axis of the cylindrical configuration and formed in the outer surface of a tubular member such that each slot contains one article extending from the slot with the outer end portions on the outer periphery of the cylindrical configuration, and each slot partially masks the inner side portions of the articles and provides a conductive connection to the articles for effecting a cathodic connection thereto in carrying out the plating.

8. An improved method of nonuniformly plating conductive, planar articles with a metal, wherein the articles are immersed in a plating bath and revolved past an anode of a plating source also having a cathode, wherein the cathode of the source is connected to the articles, and wherein the improvement comprises:

arranging the articles in a spaced, radial, fan-like manner about an axis with the planes of the articles passing through the axis and with the outer side portions of the articles on which the greatest thickness of metal is to be formed are spaced a greater distance from each other than the inner side portions of such articles; and partially masking the inner side portions of the articles as they are arranged in said manner.

9. A method of plating a nonuniform layer of gold on a nickel lead frame having opposed inner and outer side portions and opposed first and second end portions, which comprises:

placing the inner side portions of the lead frames individually in a plurality of spaced parallel, radial slots formed in the outer surface of a tubular member having its axis parallel to the slots to thereby arrange the lead frames in a spaced, radial, fan-like manner about the axis to form a hollow cylindrical configuration of the articles, with the outer side portions extending from the slots so that such portions are on the outer periphery of the cylindrical configuration and so that the outer side portions are spaced one from the other more than the inner side portions, one end of the slots being closed by a conductive base fixed to one end of the tubular member to retain the first end portion of each lead frame in its slot;

mounting an insulative capping member having a central aperture therein on the other end of the tubular member to close the other end of the slots and to retain the second end portion of each lead frame in its slot;

immersing the lead frames in a gold plating bath adjacent an anode of a plating source also having a cathode;

connecting electrically the cathode of the plating source to a shaft extending through the aperture in the capping member to the base, to the tubular member and to the inner side portions of the lead frames in the slots; and rotating the shaft to revolve the lead frames past the anode to plate the gold from the bath on the lead frames to form the gold layer thereon with the outer side portions thereof having the greatest thickness and the inner side portions thereof having the least thickness of the gold layer.

10. The method of claim 9, wherein prior to placing the lead frames in the slots of the tubular member, the bottom side of the base with the shaft and the tubular member fixed to the top side thereof is first positioned in a coacting depression in a loading cup to assist the placing of the frames in the slots, and wherein the tubular member and the base is removed from the loading cup after the slots are filled with the frames and after the capping member is fixed to the tubular member to retain the frames in the slots between the base and capping member.

11. A method of supporting planar articles in a treating medium, which comprises:

inserting a flexible wire-like member into apertures formed in the articles;

forming the wire-like member into a substantially circular configuration to arrange the articles in a spaced radial fan-like manner; and joining the ends of the wire-like member to retain the articles in said manner.

12. The method of claim 11, wherein the wire-like member is inserted alternately first into the apertures in the article and then into washers to aid in the spacing of the articles one from the other.

13. A method of plating a nonuniform thickness of gold on metallic members, which comprises:

inserting a flexible wire-like member alternatively first into apertures formed in the ends of the metallic members on which the least thickness of gold is to be plated and then into conductive spacing washers;

forming the wire-like member into a substantially circular configuration to arrange the metallic members in a hollow cylindrical configuration so that the ends of the metallic members on which the greatest thickness of gold is to be plated are located on the outer periphery of the cylindrical configuration and have the greatest spacing apart one from the other;

positioning a circular conductive plate in the center of the circular configuration and in contact with the washers;

joining the ends of the wire-like member and tightening them to force the members and washers against the disc and to retain the members in the cylindrical configuration;

connecting a rotatable shaft to the conductive plate;

immersing the metallic members in a gold plating solution adjacent an anode of a plating source;

connecting a cathode of the plating source to the shaft; and rotating the shaft to revolve the metallic members past the anode to plate gold from the solution on the members, whereby the greatest thickness of gold is formed at the ends of the members located on the outer periphery of the cylindrical configuration.

14. A method of treating planar articles, which comprises:

arranging the articles in a spaced, radial, *loose,* fan-like manner about an axis with the *axis passing through the* planes of the articles [passing through the axis] to form a cylindrical configuration of the articles, with the outer side portions of the articles *being free and* spaced a greater distance from each other than the inner side portions of such articles and with the *free,* outer portions of the articles located on the periphery of the cylindrical configuration;

partially masking the inner side portions of the articles as they are arranged in said manner;

*retaining the articles in said manner;* positoning the articles in a treating medium; and moving the articles about the axis so that the outer side portions receive the greatest exposure to and agitation in the treating medium to increase the interaction of such outer side portions with the treating medium more than the interaction of the inner side portions with such medium to thereby nonuniformly treat the articles.

References Cited

The following references, cited by the Examiner, are of record in the patented file of this patent or the original patent.

UNITED STATES PATENTS

| | | | |
|---|---|---|---|
| 3,060,944 | 10/1962 | Brollo | 134—58 |
| 3,176,850 | 4/1965 | Rosner | 211—117 |
| 3,181,706 | 5/1965 | Mandel | 211—163 |
| 3,679,517 | 7/1972 | Schulten, et al. | 156—395 |
| 3,687,144 | 8/1972 | Borcoman et al. | 134—79 |
| 3,727,620 | 4/1973 | Orr | 134—95 |
| 1,335,175 | 3/1920 | Merritt | 204—23 |
| 2,954,222 | 9/1960 | Evans | 204—297 |
| 2,438,885 | 4/1948 | Bell III | 204—212 |
| 1,108,410 | 8/1914 | Stone | 204—297 |
| 3,314,877 | 4/1967 | Novitsky | 204—297 |
| 223,564 | 1/1880 | Webb. | |
| 281,598 | 7/1883 | Wiseman. | |
| 1,807,157 | 5/1931 | Hughes. | |
| 2,663,305 | 12/1953 | Anderes, et al. | 134—140 |
| 2,927,521 | 3/1960 | Smith | 95—93 |
| 3,033,776 | 5/1962 | Rosner | 204—297 |

FOREIGN PATENTS

| | | |
|---|---|---|
| 369,949 | | Switzerland. |
| 1,205,644 | 2/1960 | France. |
| 1,166,535 | 10/1969 | Great Britain. |
| 1,130,249 | 5/1962 | Germany. |

OTHER REFERENCES

Western Electric Engineer, October 1973, pp. 2–4 "Carousel Plating a Controlled Thickness Gradient on Lead Frames by J. P. Skilbeck and A. H. Szkudlapski.

T. M TUFARIELLO, Primary Examiner

U.S. Cl. X.R.

204—199, 212, 297 W